United States Patent
Kim et al.

[11] Patent Number: 5,891,244
[45] Date of Patent: Apr. 6, 1999

[54] APPARATUS FOR THE MANUFACTURE OF SOI WAFER AND PROCESS FOR PREPARING SOI WAFER THEREWITH

[75] Inventors: Do-Hyun Kim, Taejon; Jong-Hoe Wang, Inchon, both of Rep. of Korea

[73] Assignee: Korea Advanced Institute of Science and Technology, Taejon, Rep. of Korea

[21] Appl. No.: 703,816

[22] Filed: Aug. 27, 1996

[30] Foreign Application Priority Data

Aug. 30, 1995 [KR] Rep. of Korea .................. 1995-27603

[51] Int. Cl.$^6$ .................................................. C30B 35/00
[52] U.S. Cl. ................................. 117/200; 117/2; 117/3; 117/4; 117/9; 117/43
[58] Field of Search .................................. 117/2, 3, 4, 9, 117/43; 438/481

[56] References Cited

U.S. PATENT DOCUMENTS 4,590,130  5/1986  Cline ........................................ 428/446
5,374,564  12/1994  Bruel ........................................ 438/455

OTHER PUBLICATIONS

H.W. Lam,, Simox SOI for Integrated Circuit Fabrication, IEEE Circuits and Devices Magazine, 3(4):6–11 (1987).
J.C.C. Fan et al., Graphite–Strip–Heater Zone–Melting Recrystallization of Si Films, J. Crystal Growth 63:453–483(1983).
K. Shigematsu et al., Thermal Properties of Molten Bismuth Germanates, J. Crystal, 137: 509–515 (1994).
K. Kawano et al., Crystal Growth of $Bi_4Ge_3O_{12}$ and Heat Transfer Analyses of Horizontal Bridgman Techniques, Jpn. J. Appl. Phys., 32:1736–1739 (1993).

*Primary Examiner*—Felisa Hiteshew
*Attorney, Agent, or Firm*—Jacobson, Price, Holman & Stern, PLLC

[57] ABSTRACT

The present invention provides a process for preparing SOI wafer, more specifically, a process for preparing a large-sized SOI wafer of high quality of crystallization employing an apparatus for the manufacture of the SOI wafer in a simple and efficient manner. The apparatus for the manufacture of SOI wafer of the invention comprises electric furnace for heating polycrystalline silicon filled in a heat-resistant container; means for moving up and down of an insulating substrate whose one side is accompanied with silicon single crystalline seed, and immersing the substrate in the molten silicon filled in the heat-resistant container to form a thin single crystalline film on the substrate; and, shapers to keep a constant thickness of the thin single crystalline film which is formed on the insulating substrate by the moving means. Further, a process for preparing SOI wafer of the invention comprises the steps of: preparing a molten silicon by heating polycrystalline silicon; growing a thin single crystalline film by moving down one or more insulating substrate whose one side is accompanied with the silicon single crystalline seed to immerse the seed in the molten silicon, and moving up one or more insulating substrates to solidify the silicon deposited on the substrates; and, keeping a constant thickness of the thin single crystalline film which is formed on the insulating substrate employing a shaper.

15 Claims, 2 Drawing Sheets

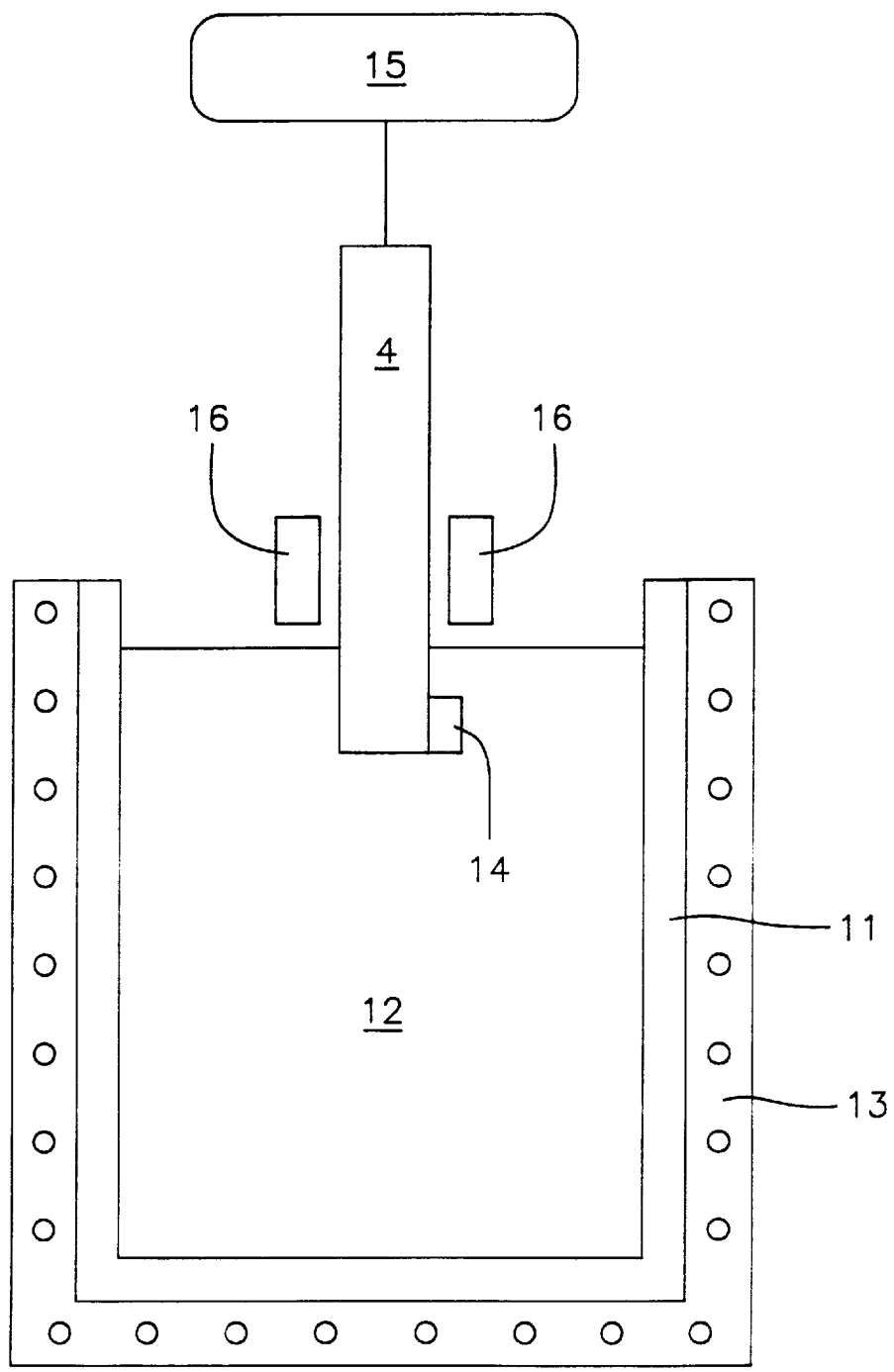

APPARATUS FOR THE MANUFACTURE OF SOI WAFER AND PROCESS FOR PREPARING SOI WAFER THEREWITH

FIELD OF THE INVENTION

The present invention relates to a process for preparing SOI wafer, more specifically, a process for preparing a large-sized SOI wafer of high quality of crystallization employing an apparatus for the manufacture of the SOI wafer in a simple and efficient manner.

BACKGROUND OF THE INVENTION

In general, SOI(silicon-on-insulator) wafer which is an essential device widely used in various electronic instruments, control systems and communication equipments, has a structure of thin single crystalline silicon film which plays a role as active area on insulating layer consisting of thin insulating film such as silica.

FIG. 1 shows a schematic diagram of the conventional SOI wafer which has a structure consisting of single crystalline silicon wafer(1), thin insulating film(2) positioned on the silicon wafer(1), and thin single crystalline silicon film(3) on the insulating film(2).

A variety of technologies for the manufacture of the conventional SOI wafer have been reported in the art:

Frey, R. C. et al. disclose a process for preparing SOI wafer by employing wafer bonding method which comprises the steps of contacting two silicon wafers having oxidized membrane of silica each other by facing both sides having the silica membrane or contacting one side having the said silica membrane, bonding them by heat treatment and forming thin silicon film by the aid of polishing and chemical etching of the other side of slicon wafer(see: Frey, R. C. et al., J. Elecetrochem. Soc., 133:1673(1986)).

Lam, H. W. describes a process for preparing SOI wafer by SIMOX(separation by implanted oxygen) method which comprises implanting oxygen ion of high energy into a silicon wafer to form an oxidized layer implanted on the silicon wafer(see: Lam, H. W., IEEE Circuits and Dev. Mag., 3(4):6–11(1987)).

Further, Fan, J. C. C. et al. teach a ZMR(zone melting recrystallization) technique which comprises the steps of partial heating of thin amorphous or polycrystalline silicon film on thin insulating membrane such as silica to form molten zone on the membrane, and producing a thin silicon film which is solidified to the moving direction of energy source to grow single crystalline silicon(see: Fan, J. C. C. et al., J. Crystal Growth, 63:453–483(1983)).

However, the said prior art processes are proven to be less satisfactory in the sense that they are complex, and provide low degree of crystallization of the thin single crystalline silicon film as active area of SOI wafer due to the use of thin insulating membrane, which, in turn, produce a limited size of SOI wafer only, and in which gettering process to remove defects or contaminants of SOI wafer can not be readily employed.

Under the circumstances, there are strong reasons for exploring and developing a novel process for preparing a, large-sized SOI wafer in a simple and efficient manner.

SUMMARY OF THE INVENTION

In accordance with the present invention, the inventors successfully prepared a large-sized SOI wafer employing an insulating substrate instead of insulating membrane in a simple and efficient manner, with an apparatus for the manufacture of SOI wafer.

A primary object of the present invention is, therefore, to provide a process for preparing a large-sized SOI wafer of high quality of crystallization in a simple and efficient manner.

The other object of the invention is to provide an apparatus for the manufacture of the SOI wafer.

BRIEF DESCRIPTION OF DRAWINGS

The above and the other objects and features of the present invention will become apparent from the following description given in conjunction with the accompanying drawings, in which:

FIG. 3 is a schematic diagram showing an apparatus for the manufacture of the SOI wafer.

DETAILED DESCRIPTION OF THE INVENTION

The present inventors have made an effort to solve the problems of the prior art processes, and developed an apparatus for the manufacture of SOI wafer to prepare a large-sized SOI wafer employing an insulating substrate.

An apparatus for the manufacture of SOI wafer of the invention comprises:

means for heating polycrystalline silicon filled in a heat-resistant container to obtain a molten silicon;

means for moving up and down of an insulating substrate whose one side is accompanied with silicon single crystalline seed, and immersing the substrate in the molten silicon to form a thin single crystalline film on the substrate; and, a shaper to keep a constant thickness of the thin single crystalline film which is formed on the insulating substrate by the moving means.

In the apparatus of the invention, any crucible conventionally used in the art may be employed as the heat-resistant container, and an electric furnace is preferably employed as the heating means.

Further, a process for preparing SOI wafer employing the said apparatus comprises the steps of:

(i) preparing a molten silicon by heating polycrystalline silicon filled in a heat-resistant container over 1400° C. by the aid of heating means;

(ii) growing a thin single crystalline film by moving down one or more insulating substrate whose one side is accompanied with silicon single crystalline seed to immerse the seed in the molten silicon, and moving up the insulating substrate to solidify the silicon deposited on the substrate by the aid of moving means; and, (iii) keeping a constant thickness of the thin single crystalline film which is formed on the insulating substrate by the aid of a shaper.

In the process of the invention, any substrate possessing insulating property may be employed as the insulating substrate, though silica substrate or sapphire is the most preferred; and, any solution of molten materials of crystalline or polycrystalline which can function as active area of SOI wafer in addition to the molten silicon, may be employed as the molten solution. Moreover, if necessary, a step of implanting inert gas to the molten silicon may be further employed in the course of growing the thin single crystalline film.

In a case that SOI wafer is prepared by the use of two or more insulating substrates, each of which is accompanied with silicon single crystalline seed, a powder-type material such as boron nitride is preferably added between the substrates so as to ease the separation of the substrates after formation of thin single crystalline film thereon.

A preferred embodiment of the present invention is explained in more detail with references of the accompanying drawings, which should not be taken to limit the scope of the invention.

Figure 1:
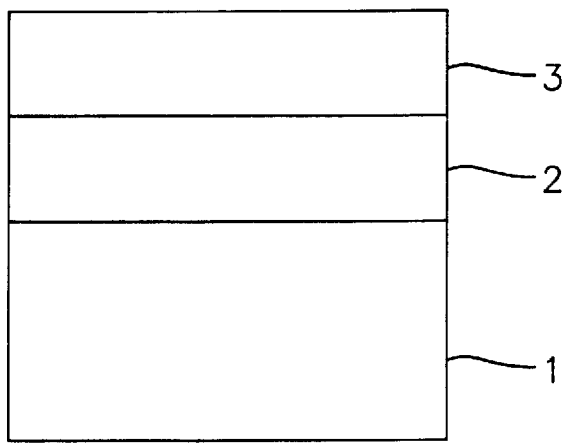
FIG. 1 is a schematic diagram showing the conventional SOI wafer.
Figure 2:
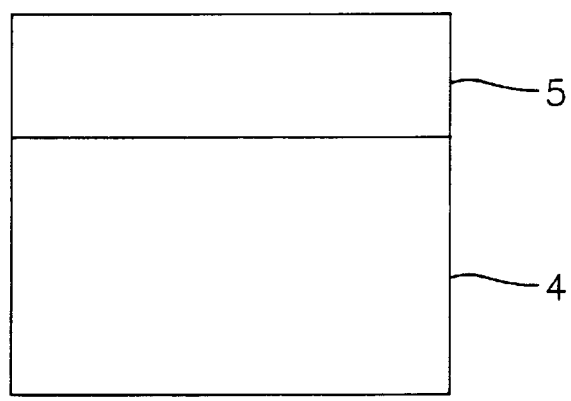
FIG. 2 is a schematic diagram showing SOI wafer of the invention.

FIG. 2 is a schematic diagram showing SOI wafer of the invention which comprises an insulating substrate(4) such as sapphire and a thin single crystalline silicon film(5) positioned on the substrate(4). The said SOI wafer has a high degree of crystallization of thin single crystalline silicon film which plays a role as active area, since it is prepared by employing an insulating substrate as an insulating layer, which allows easy preparation of a large-sized SOI wafer. In this regard, SOI wafer of the present invention is quitely different from the conventional SOI wafer employing an insulating membrane which naturally limits the size of SOI wafer.

The SOI wafer of the invention is prepared by the apparatus depicted in FIG. 3. The said apparatus comprises means(13) for heating polycrystalline silicon filled in a heat-resistant container(11); means(15) for moving up and down of an insulating substrate(4) whose one side is accompanied with silicon single crystalline seed(14), and immersing the substrate(4) in the molten silicon filled in the heat-resistant container(11) to form a thin single crystalline film(5) on the substrate(4); and, shapers(16) to keep a constant thickness of the thin single crystalline film(5) which is formed on the insulating substrate(4) by the moving means(15).

The process for preparing SOI wafer employing the apparatus of the invention is further illustrated as following: Molten silicon is obtained by heating polycrystalline silicon (12) filled in a heat-resistant container(11) over 1400° C. by the heating means(13). Then, a thin single crystalline film(5) is grown by moving down one or more insulating substrate (4) whose one side is accompanied with silicon single crystalline seed(14), immersing the seed(14) in the molten silicon, and moving up the insulating substrate(4) to solidify the silicon deposited on the substrate(4) employing the moving means(15). When the insulating substrate(4) moves up by the moving means(15), shapers(16) keep a constant thickness of the thin single crystalline film(5) which is formed on the insulating substrate(4) to prepare SOI wafer of the invention.

In the preparation of SOI wafer of the invention, if necessary, a step of implanting inert gas to the molten silicon may be further employed in the course of growing thin single crystalline film(5). If SOI wafer is prepared by employing two or more insulating substrates(4) with silicon single crystalline seeds(14) simultaneously, a powder-type material such as boron nitride is preferably added between the substrates so as to separate the substrates(4) easily, after formation of thin single crystalline film(5) on the substrates (4).

The process for preparing SOI wafer of the present invention is further illustrated by the following examples, which should not be taken to limit the scope of the invention.

EXAMPLE 1

A crucible(11) of 10 cm×10 cm was filled with polycrystalline silicon(12), and heated at 1412° C. by an electric furnace(13) to obtain the molten silicon. Then, thin single crystalline film(5) is grown at a rate of 10 mm/sec, by moving down an insulating substrate(4) whose one side is accompanied with silicon single crystalline seed(14), immersing the seed(14) in the molten silicon, and moving up the substrate(4) to solidify the silicon deposited on the insulating substrate(4) employing moving means(15) for moving the insulating substrate(4). When the insulating substrate(4) was moved up by the moving means(15), sharpers(16) kept a constant thickness of the thin single crystalline film(5) which was formed on the insulating substrate(4) finally to prepare SOI wafer of the invention.

EXAMPLE 2

Two SOI wafers of the invention were prepared in an analogous manner as in Example 1, with the except in that boron nitride was added between two insulating substrates (4) with silicon single crystalline seeds(14) to separate the substrates(4) after formation of thin single crystalline film (5).

As clearly illustrated and demonstrated above, the present invention provides a process for preparing a large-sized SOI wafer of high quality of crystallization employing an apparatus for the manufacture for the SOI wafer in a simple and efficient manner.

What is claimed is:

1. A process for preparing a SOI wafer which comprises the steps of:

(i) preparing a molten silicon by heating polycrystalline silicon filled in a heat-resistant container over 1400° C. by the aid of heating means;

(ii) growing a thin single crystalline film by moving down one or more insulating substrate whose one side is accompanied with silicon single crystalline seed to immerse the seed in the molten silicon, and moving up the insulating substrate to solidify the silicon deposited on the substrate by the aid of moving means; and, (iii) keeping a constant thickness of the thin single crystalline film which is formed on the insulating substrate by the aid of a shaper.

2. The process for preparing SOI wafer of claim 1, wherein the insulating substrate is silica or sapphire.

3. The process for preparing a SOI wafer of claim 1, which further comprises a step of implanting inert gas to the molten silicon in the course of growing a thin single crystalline film.

4. A. The process for preparing a SOI wafer of claim 1, wherein ceramic powder material is further added between insulating substrates, when two or more insulating substrates with silicon single crystalline seeds are employed simultaneously.

5. The process for preparing a SOI wafer of claim 4, wherein ceramic powder material is boron nitride.

6. A process for preparing a SOI wafer which comprises the steps of:

(i) preparing a molten silicon;

(ii) growing a thin single crystalline film by moving an insulating substrate having one side accompanied with a silicon single crystalline seed to immerse the seed in the molten silicon, and then removing the insulating substrate from the molten silicon to solidify the silicon deposited on the substrate; and, (iii) keeping a constant thickness of the thin single crystalline film which is formed on the insulating substrate.

7. The process for preparing a SOI wafer of claim 6, wherein the insulating substrate is silica or sapphire.

8. The process for preparing a SOI wafer of claim 6, which further comprises a step of implanting inert gas to the molten silicon in the course of growing a thin single crystalline film.

9. The process for preparing a SOI wafer of claim 6, wherein ceramic powder material is further added between insulating substrates, when two or more insulating substrates with silicon single crystalline seeds are employed simultaneously.

10. The process for preparing a SOI wafer of claim 9, wherein ceramic powder material is boron nitride.

11. A process for preparing a SOI wafer comprising the steps of preparing a molten silicon, providing an insulating substrate having a silicon single crystalline seed on one side, immersing the insulating substrate in the molten silicon to grow a thin single crystalline film, removing the insulating substrate from the molten silicon to solidify silicon deposited on the substrate, and maintaining a constant thickness of the thin single crystalline film during the step of removing.

12. The process for preparing a SOI wafer of claim 11, wherein the insulating substrate is silica or sapphire.

13. The process for preparing a SOI wafer of claim 11, which further comprises a step of implanting inert gas to the molten silicon in the course of growing a thin single crystalline film.

14. The process for preparing a SOI wafer of claim 11, wherein ceramic powder material is further added between insulating substrates, when two or more insulating substrates with silicon single crystalline seeds are employed simultaneously.

15. The process for preparing a SOI wafer of claim 14, wherein ceramic powder material is boron nitride.

* * * * *